(12) United States Patent
Chung et al.

(10) Patent No.: US 8,779,660 B2
(45) Date of Patent: Jul. 15, 2014

(54) ILLUMINATION DEVICE FOR ENHANCING PLANT GROWTH

(75) Inventors: Chia-Tin Chung, Miaoli County (TW); Shih-Neng Tai, Taoyuan County (TW)

(73) Assignee: Paragon Semiconductor Lighting Technology Co., Ltd., New Taipei (TW)

( * ) Notice: Subject to any disclaimer, the term of this patent is extended or adjusted under 35 U.S.C. 154(b) by 494 days.

(21) Appl. No.: 13/239,679

(22) Filed: Sep. 22, 2011

(65) Prior Publication Data

US 2013/0076239 A1 Mar. 28, 2013

(51) Int. Cl.
*H01J 63/04* (2006.01)

(52) U.S. Cl.
USPC ............. 313/512; 313/502; 313/503; 313/46; 313/358

(58) Field of Classification Search
USPC ............ 313/502, 503, 46, 113, 358, 512, 498
See application file for complete search history.

(56) References Cited

U.S. PATENT DOCUMENTS

| | | | |
|---|---|---|---|
| 2011/0031865 A1* | 2/2011 | Hussell et al. | 313/46 |
| 2013/0188349 A1* | 7/2013 | Chung et al. | 362/235 |

* cited by examiner

*Primary Examiner* — Tuyet Thi Vo
(74) *Attorney, Agent, or Firm* — Rosnberg, Klein & Lee

(57) ABSTRACT

An illumination device for enhancing plant growth includes a substrate unit, a light-emitting unit, a current-limiting unit, and a control unit. The substrate unit includes a substrate body. The light-emitting unit, the current-limiting unit, and the control unit are disposed on the substrate body. The light-emitting unit includes a first light-emitting module, a second light-emitting module, and a third light-emitting module. The current-limiting unit includes a first current-limiting chip electrically connected to the first light-emitting module, a second current-limiting chip electrically connected to the second light-emitting module, and a third current-limiting chip electrically connected to the third light-emitting module. The control unit includes a first PWM control module electrically connected to the first current-limiting chip, a second PWM control module electrically connected to the second current-limiting chip, and a third PWM control module electrically connected to the third current-limiting chip.

20 Claims, 11 Drawing Sheets

ILLUMINATION DEVICE FOR ENHANCING PLANT GROWTH

BACKGROUND OF THE INVENTION

1. Field of the Invention

The instant disclosure relates to an illumination device, and more particularly, to an illumination device for enhancing plant growth.

2. Description of Related Art

The invention of the lamp greatly changed the style of building construction and the living style of human beings, allowing people to work during the night. Traditional lighting devices such as lamps that adopt incandescent bulbs, fluorescent bulbs, or power-saving bulbs have been generally well-developed and used intensively indoor illumination. However, compared to the newly developed light-emitting-diode (LED) lamps, these traditional lamps have the disadvantages of quick attenuation, high power consumption, high heat generation, short working life, high fragility, and being not recyclable. Thus, various LED illumination devices are created to replace the traditional lighting devices.

SUMMARY OF THE INVENTION

One aspect of the instant disclosure relates to an illumination device for enhancing plant growth.

One of the embodiments of the instant disclosure provides an illumination device for enhancing plant growth, comprising: a substrate unit, a light-emitting unit, a current-limiting unit, a control unit, a frame unit, and a package unit.

The substrate unit includes a substrate body having a first chip-placing region, a second chip-placing region, and a third chip-placing region, wherein the first chip-placing region, the second chip-placing region, and the third chip-placing region are disposed on the top surface of the substrate body. The light-emitting unit includes a first light-emitting module for generating a first optical wavelength, a second light-emitting module for generating a second optical wavelength, and a third light-emitting module for generating a third optical wavelength and a predetermined color temperature, wherein the first light-emitting module includes a plurality of first LED chips disposed on the first chip-placing region and electrically connected to the substrate body, the second light-emitting module includes a plurality of second LED chips disposed on the second chip-placing region and electrically connected to the substrate body, and the third light-emitting module includes a plurality of third LED chips disposed on the second chip-placing region and electrically connected to the substrate body.

The current-limiting unit includes a first current-limiting chip disposed on the substrate body and electrically connected to the first light-emitting module, a second current-limiting chip disposed on the substrate body and electrically connected to the second light-emitting module, and a third current-limiting chip disposed on the substrate body and electrically connected to the third light-emitting module. The control unit includes a first PWM control module disposed on the substrate body and electrically connected to the first current-limiting chip, a second PWM control module disposed on the substrate body and electrically connected to the second current-limiting chip, and a third PWM control module disposed on the substrate body and electrically connected to the third current-limiting chip.

The frame unit includes a first surrounding colloid frame, a second surrounding colloid frame, and a third surrounding colloid frame, wherein the first surrounding colloid frame, the second surrounding colloid frame, and the third surrounding colloid frame are surroundingly formed on the top surface of the substrate body, the first surrounding colloid frame surrounds the first LED chips to form a first colloid position limiting space corresponding to the first chip-placing region, the second surrounding colloid frame surrounds the second LED chips to form a second colloid position limiting space corresponding to the second chip-placing region, and the third surrounding colloid frame surrounds the third LED chips to form a third colloid position limiting space corresponding to the third chip-placing region. The package unit includes a first package colloid body filled into the first colloid position limiting space to cover the first LED chips, a second package colloid body filled into the second colloid position limiting space to cover the second LED chips, and a third package colloid body filled into the third colloid position limiting space to cover the third LED chips, wherein the first package colloid body is surrounded by the first surrounding colloid frame, the second package colloid body is surrounded by the second surrounding colloid frame, and the third package colloid body is surrounded by the third surrounding colloid frame.

Another one of the embodiments of the instant disclosure provides an illumination device for enhancing plant growth, comprising: a substrate unit, a light-emitting unit, a current-limiting unit, and a control unit.

The substrate unit includes a substrate body having a first chip-placing region, a second chip-placing region, and a third chip-placing region, wherein the first chip-placing region, the second chip-placing region, and the third chip-placing region are disposed on the top surface of the substrate body. The light-emitting unit includes a first light-emitting module for generating a first optical wavelength, a second light-emitting module for generating a second optical wavelength, and a third light-emitting module for generating a third optical wavelength and a predetermined color temperature, wherein the first light-emitting module includes a plurality of first LED chips disposed on the first chip-placing region and electrically connected to the substrate body, the second light-emitting module includes a plurality of second LED chips disposed on the second chip-placing region and electrically connected to the substrate body, and the third light-emitting module includes a plurality of third LED chips disposed on the second chip-placing region and electrically connected to the substrate body.

The current-limiting unit includes a first current-limiting chip disposed on the substrate body and electrically connected to the first light-emitting module, a second current-limiting chip disposed on the substrate body and electrically connected to the second light-emitting module, and a third current-limiting chip disposed on the substrate body and electrically connected to the third light-emitting module. The control unit includes a first PWM control module disposed on the substrate body and electrically connected to the first current-limiting chip, a second PWM control module disposed on the substrate body and electrically connected to the second current-limiting chip, and a third PWM control module disposed on the substrate body and electrically connected to the third current-limiting chip.

Therefore, the first PWM control module can control the first LED chips to generate a predetermined pulse frequency, the second PWM control module can control the second LED chips to generate a predetermined pulse frequency, and the third PWM control module can control the third LED chips to generate a predetermined pulse frequency, thus the illumination device of the instant disclosure can be used to enhance plant growth.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

First Embodiment

Figure 1A:
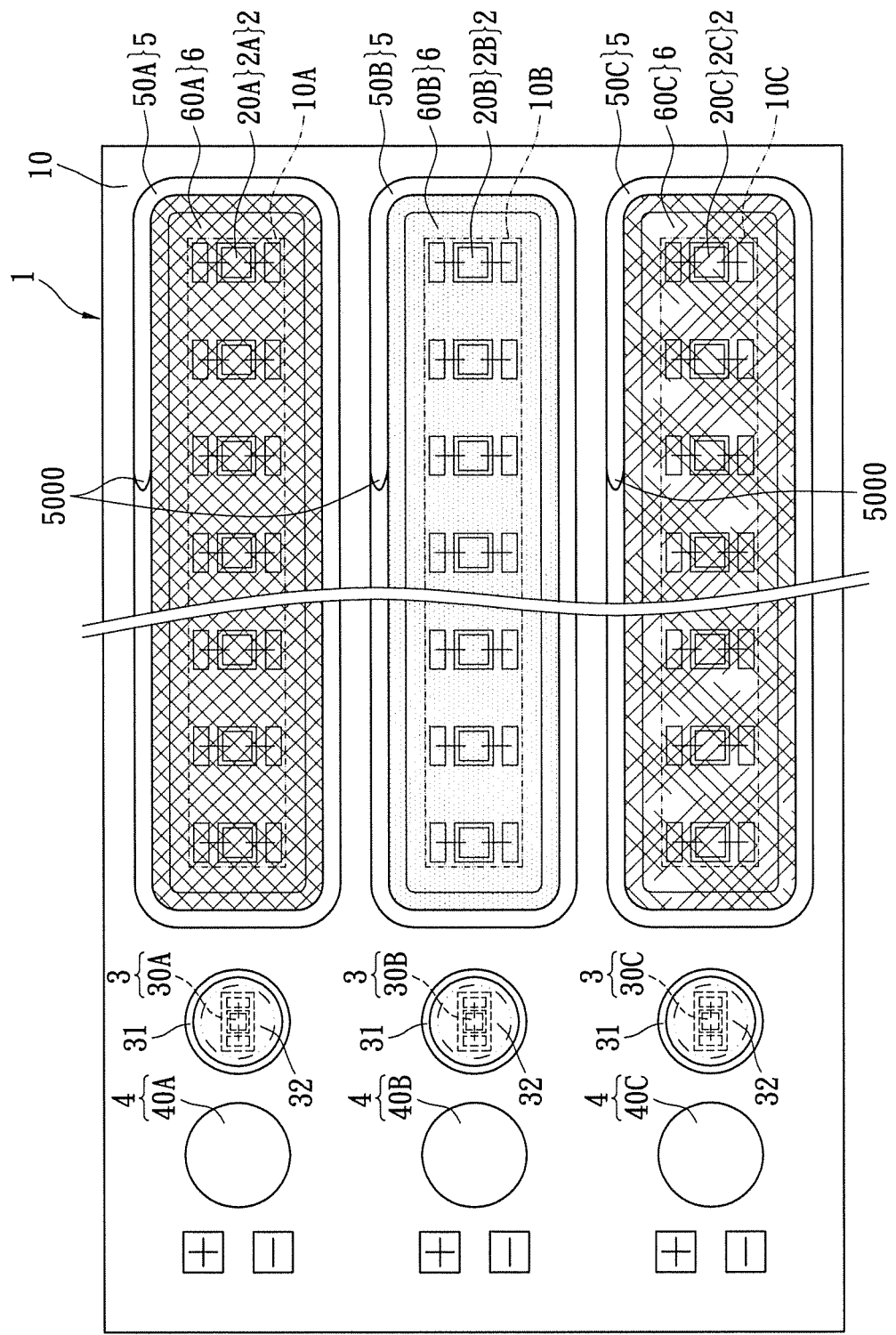
FIG. 1A shows a top, schematic view of the illumination device according to the first embodiment of the instant disclosure.

Referring to FIGS. 1A to 1D, where the first embodiment of the instant disclosure provides an illumination device for enhancing plant growth, comprising: a substrate unit 1, a light-emitting unit 2, a current-limiting unit 3, a control unit 4, a frame unit 5, and a package unit 6.

Figure 1B:
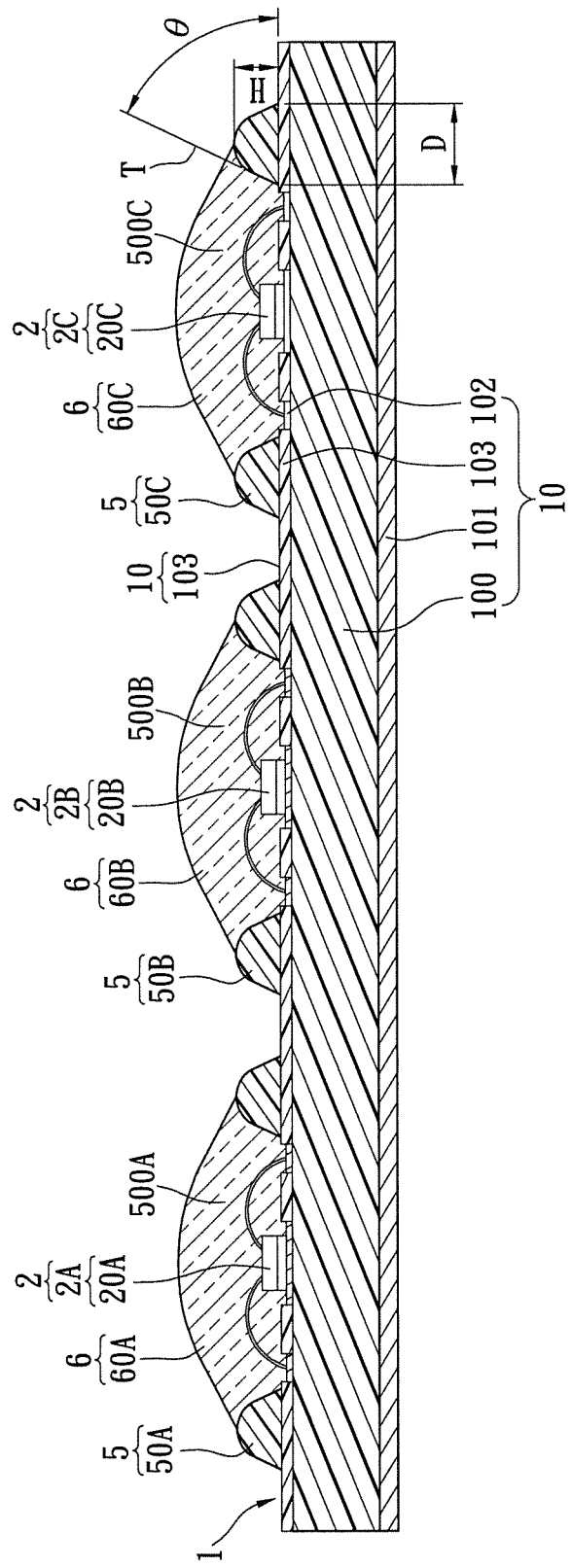
FIG. 1B shows a lateral, cross-sectional, schematic view of the illumination device according to the first embodiment of the instant disclosure.

Referring to FIGS. 1A and 1B, the substrate unit 1 includes a substrate body 10 having a first chip-placing region 10A, a second chip-placing region 10B, and a third chip-placing region 10C. The first chip-placing region 10A, the second chip-placing region 10B, and the third chip-placing region 10C are disposed on the top surface of the substrate body 10. For example, the substrate body 10 includes a circuit substrate 100, a heat-dissipating layer 101 disposed on the bottom surface of the circuit substrate 100, a plurality conductive pads 102 disposed on the top surface of the circuit substrate 100, and an insulative layer 103 disposed on the top surface of the circuit substrate 100 to expose the conductive pads 102. Hence, the heat-dissipating efficiency of the circuit substrate 100 is increased by using the heat-dissipating layer 101, and the insulative layer 103 is a solder mask for only exposing the conductive pads 102 in order to achieve local soldering. However, the above-mentioned definition of the substrate body 10 is not to limit the instant disclosure.

Referring to FIGS. 1A and 1B, the light-emitting unit 2 includes a first light-emitting module 2A for generating a first optical wavelength, a second light-emitting module 2B for generating a second optical wavelength, and a third light-emitting module 2C for generating a third optical wavelength and a predetermined color temperature. The first light-emitting module 2A includes a plurality of first LED chips 20A disposed on the first chip-placing region 10A and electrically connected to the substrate body 10, the second light-emitting module 2B includes a plurality of second LED chips 20B disposed on the second chip-placing region 10B and electrically connected to the substrate body 10, and the third light-emitting module 2C includes a plurality of third LED chips 20C disposed on the second chip-placing region 10C and electrically connected to the substrate body 10. For example, each first LED chip 20A may be a red LED bare chip, each second LED chip 20B may be a blue LED bare chip, and each third LED chip 20C may be a blue LED bare chip. In addition, each first LED chip 20A, each second LED chip 20B, and each third LED chip 20C can be electrically connected to the substrate body by wire bonding.

Figure 1C:
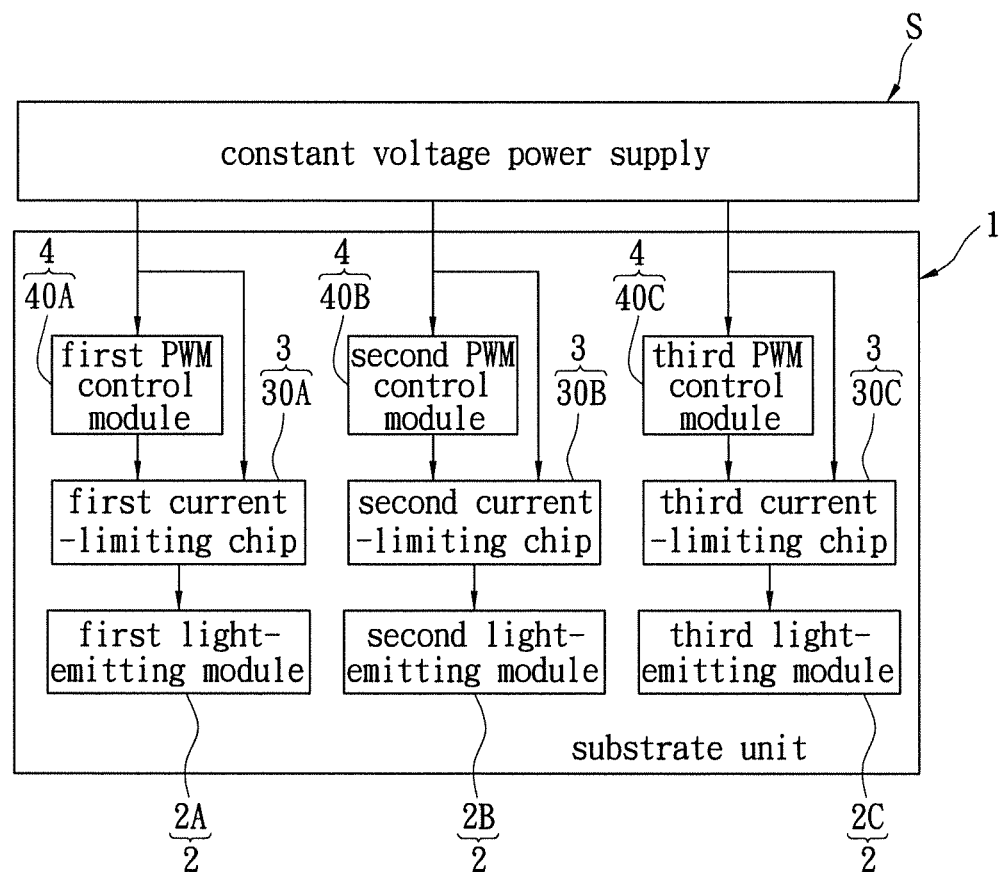
FIG. 1C shows a function block of the illumination device according to the first embodiment of the instant disclosure.

Referring to FIGS. 1A, 1B, and 1C, the current-limiting unit 3 includes a first current-limiting chip 30A disposed on the substrate body 10 and electrically connected to the first light-emitting module 2A, a second current-limiting chip 30B disposed on the substrate body 10 and electrically connected to the second light-emitting module 2B, and a third current-limiting chip 30C disposed on the substrate body 10 and electrically connected to the third light-emitting module 2C. For example, the first current-limiting chip 30A, the second current-limiting chip 30B, and the third current-limiting chip 30C can be electrically connected to the substrate body by wire bonding. In addition, the first current-limiting chip 30A can be surrounded by a surrounding colloid frame 31 and be covered with a package colloid body 32, the second current-limiting chip 30B can be surrounded by a surrounding colloid frame 31 and be covered with a package colloid body 32, and the third current-limiting chip 30C can be surrounded by a surrounding colloid frame 31 and be covered with a package colloid body 32. Each package colloid body 32 can be an opaque resin body for preventing the current-limiting unit 3 from being damaged or affected by lighting of the light-emitting unit 2. Moreover, the current-limiting unit 3 can be electrically connected between the constant voltage power supply S and the light-emitting unit 2 (as shown in FIG. 1C). In other words, the current-limiting unit 3 is electrically connected between the constant voltage power supply S and the light-emitting unit 2, thus the light-emitting unit 2 can obtain constant voltage from the constant voltage power supply S through the current-limiting unit 3.

Referring to FIGS. 1A, 1B, and 1C, the control unit 4 includes a first PWM (Pulse Width Modulation) control module 40A disposed on the substrate body 10 and electrically connected to the first current-limiting chip 30A, a second PWM control module 40B disposed on the substrate body 10 and electrically connected to the second current-limiting chip 30B, and a third PWM control module 40C disposed on the substrate body 10 and electrically connected to the third current-limiting chip 30C. For example, when the control unit 4 is electrically connected between the constant voltage power supply S and the current-limiting unit 3, the first PWM control module 40A can control the first LED chips 20A to generate a predetermined pulse frequency (such as 50 Hz, 60 Hz, . . . , 120 Hz, etc.), the second PWM control module 40B can control the second LED chips 20B to generate a predetermined pulse frequency, and the third PWM control module 40C can control the third LED chips 20C to generate a predetermined pulse frequency.

Referring to FIGS. 1A and 1B, the frame unit 5 includes a first surrounding colloid frame 50A, a second surrounding colloid frame 50B, and a third surrounding colloid frame 50C. The first surrounding colloid frame 50A, the second surrounding colloid frame 50B, and the third surrounding colloid frame 50C are surroundingly formed on the top surface of the substrate body 10. In addition, the first surrounding colloid frame 50A surrounds the first LED chips 20A to form a first colloid position limiting space 500A corresponding to the first chip-placing region 10A, the second surrounding colloid frame 50B surrounds the second LED chips 20B to form a second colloid position limiting space 500B corresponding to the second chip-placing region 10B, and the third surrounding colloid frame 50C surrounds the third LED chips 20C to form a third colloid position limiting space 500C corresponding to the third chip-placing region 10C. Moreover, the first surrounding colloid frame 50A, the second surrounding colloid frame 50B, and the third surrounding colloid frame 50C can be separated from each other by a predetermined distance. The first colloid position limiting space 500A, the second colloid position limiting space 500B, and the third colloid position limiting space 500C can be separated from each other by a predetermined distance.

For example, the method for forming the first surrounding colloid frame 50A (or the second surrounding colloid frame 50B, or the third surrounding colloid frame 50C) includes: surroundingly coating liquid colloid (not shown) on the top surface of the substrate body 10, and then hardening or curing the liquid colloid to form the first surrounding colloid frame 50A (or the second surrounding colloid frame 50B, or the third surrounding colloid frame 50C). In addition, the liquid colloid can be coated on the substrate body 10 to form any shapes according to different requirements (such as a circular shape, a square or a rectangular shape etc.). The thixotropic index of the liquid colloid may be between 4 and 6, the pressure of coating the liquid colloid on the top surface of the substrate body 10 may be between 350 kpa and 450 kpa, and the velocity of coating the liquid colloid on the top surface of the substrate body 10 may be between 5 mm/s and 15 mm/s. The liquid colloid is surroundingly coated on the top surface of the substrate body 10 from a start point to a termination point, and the position of the start point and the position of the termination point are substantially the same, thus the first surrounding colloid frame 50A has a micro convex portion 5000 close to the start point and the termination point. In other words, when the first surrounding colloid frame 50A (or the second surrounding colloid frame 50B, or the third surrounding colloid frame 50C) is going to finish by surroundingly coating, the micro convex portion 5000 can be formed naturally on the first surrounding colloid frame 50A (or the second surrounding colloid frame 50B, or the third surrounding colloid frame 50C). Furthermore, the liquid colloid is hardened by baking, the baking temperature may be between 120° C. and 140° C., and the baking time may be between 20 minute and 40 minute. Therefore, the first surrounding colloid frame 50A has an arc shape formed on the top surface thereof, the first surrounding colloid frame 50A has a radius tangent T and the angle θ of the radius tangent T relative to the top surface of the substrate body 10 may be between 40° C. and 50° C., the maximum height H of the first surrounding colloid frame 50A relative to the top surface of the substrate body 10 may be between 0.3 mm and 0.7 mm, the width D of the bottom side of the first surrounding colloid frame 50A may be between 1.5 mm and 3 mm, the thixotropic index of the first surrounding colloid frame 50A may be between 4 and 6, and the first surrounding colloid frame 50A is formed by mixing inorganic additive with white thermohardening colloid.

Referring to FIGS. 1A and 1B, the package unit 6 includes a first package colloid body 60A filled into the first colloid position limiting space 500A to cover the first LED chips 20A, a second package colloid body 60B filled into the second colloid position limiting space 500B to cover the second LED chips 20B, and a third package colloid body 60C filled into the third colloid position limiting space 500C to cover the third LED chips 20C. In addition, the first package colloid body 60A can be surrounded by the first surrounding colloid frame 50A, the second package colloid body 60B can be surrounded by the second surrounding colloid frame 50B, and the third package colloid body 60C can be surrounded by the third surrounding colloid frame 50C.

For example, the first package colloid body 60A may be a transparent resin body, thus the first optical wavelength generated by the first light-emitting module 2A having a plurality of red LED chips may be substantially between 600 nm and 700 nm. The second package colloid body 60B may be a transparent resin body, thus the second optical wavelength generated by the second light-emitting module 2B having a plurality of blue LED chips may be substantially between 400 nm and 500 nm. The third package colloid body 60C may be a phosphor resin body, thus the third optical wavelength generated by the third light-emitting module 2C having a plurality of blue LED chips may be substantially between 400 nm and 700 nm, and the predetermined color temperature generated by the third light-emitting module 2C may be substantially between 2700 K and 10000 K. However, the package unit 6 used in the first embodiment is merely an example and is not meant to limit the instant disclosure.

Figure 1D:
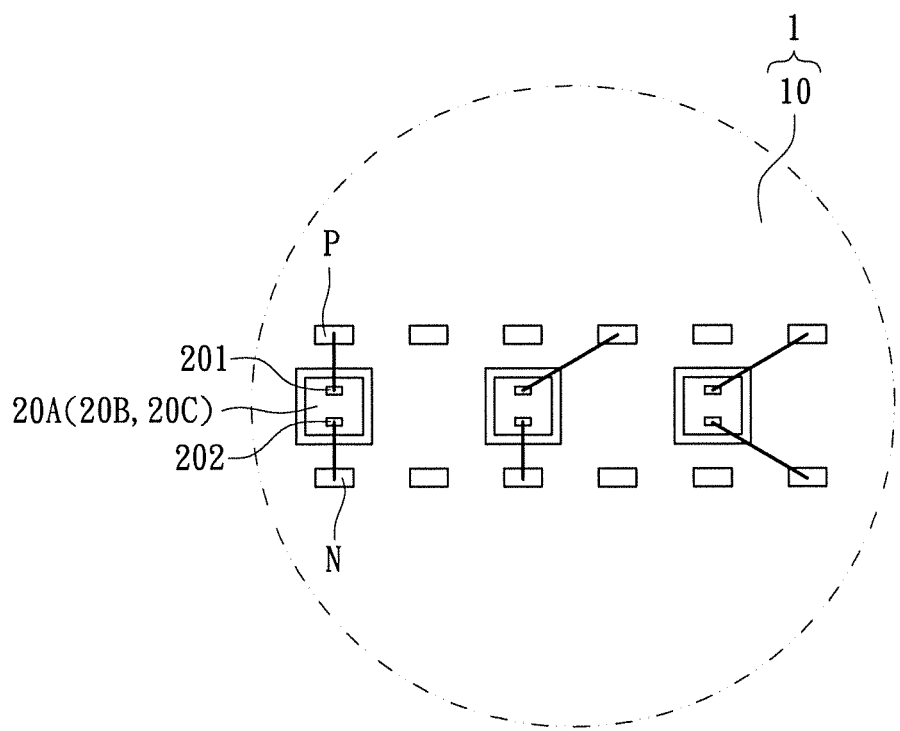
FIG. 1D shows a partial, top, schematic view of the substrate unit using a plurality of standby pads.

Referring to FIG. 1D, the substrate unit 1 includes a plurality of positive pads P and negative pads N disposed on the top surface of the substrate body 10. Each first LED chip 20A has a positive electrode 201 and a negative electrode 202, the positive electrode 201 of each first LED chip 20A corresponds to at least two of the positive pads P, and the negative electrode 202 of each first LED chip 20A corresponds to at least two of the negative pads N. Each second LED chip 20B has a positive electrode 201 and a negative electrode 202, the positive electrode 201 of each second LED chip 20B corresponds to at least two of the positive pads P, and the negative electrode 202 of each second LED chip 20B corresponds to at least two of the negative pads N. Each third LED chip 20C has a positive electrode 201 and a negative electrode 202, the positive electrode 201 of each third LED chip 20C corresponds to at least two of the positive pads P, and the negative electrode 202 of each third LED chip 20C corresponds to at least two of the negative pads N.

Referring to FIG. 1D again, the positive electrode 201 of each first LED chip 20A is electrically connected to one of the at least two positive pads P, and the negative electrode 202 of each first LED chip 20A is electrically connected to one of the at least two negative pads N. The positive electrode 201 of each second LED chip 20B is electrically connected to one of the at least two positive pads P, and the negative electrode 202 of each second LED chip 20B is electrically connected to one of the at least two negative pads N. The positive electrode 201 of each third LED chip 20C is electrically connected to one of the at least two positive pads P, and the negative electrode 202 of each third LED chip 20C is electrically connected to one of the at least two negative pads N.

Second Embodiment

Figure 2:
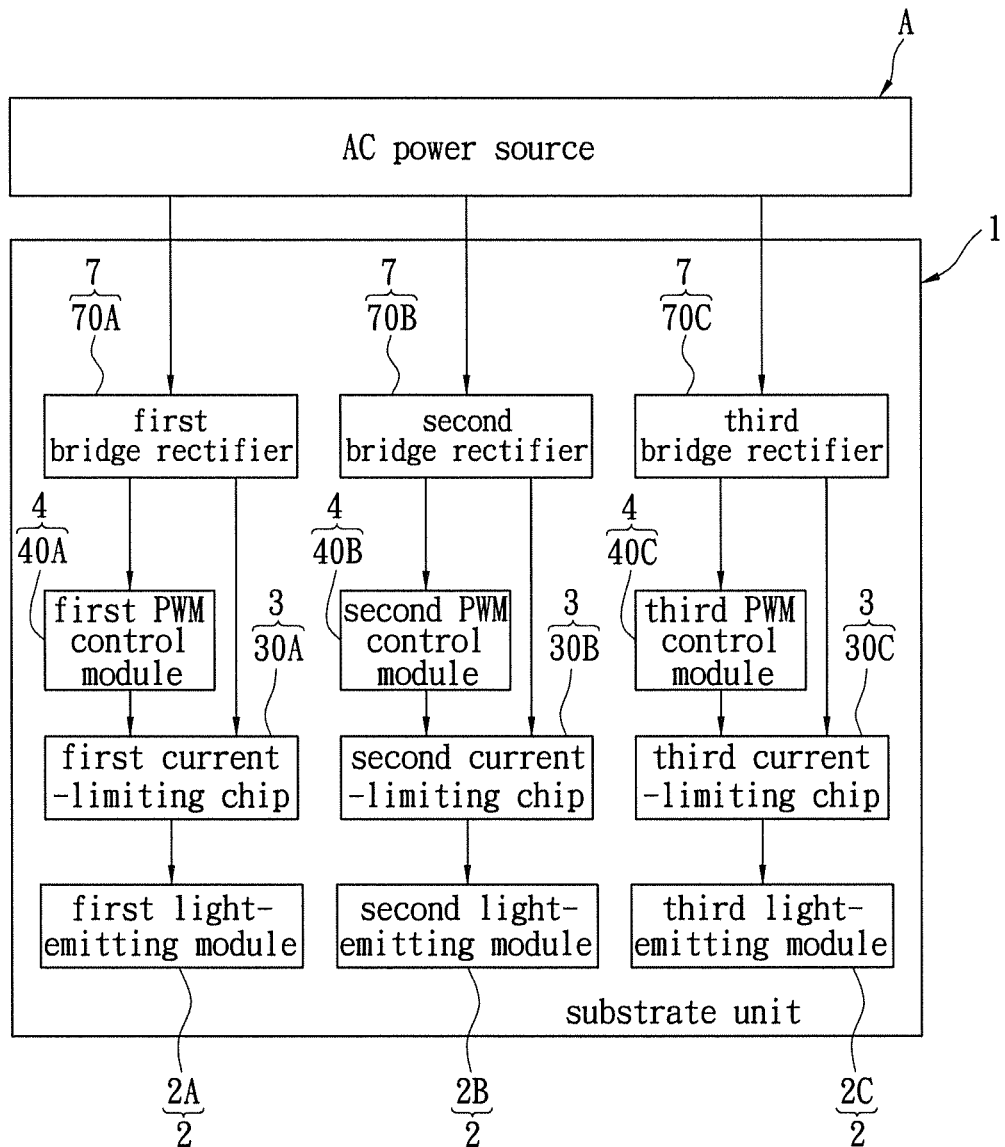
FIG. 2 shows a function block of the illumination device according to the second embodiment of the instant disclosure.

Referring to FIG. 2, where the second embodiment of the instant disclosure provides an illumination device for enhancing plant growth. Comparing FIG. 2 with FIG. 1C, the difference between the second embodiment and the first embodiment is as follows: the illumination device of the second embodiment further comprises a rectifier unit 7 including a first bridge rectifier 70A disposed on the substrate body 10 and electrically connected to the first current-limiting chip 30A, a second bridge rectifier 70B disposed on the substrate body 10 and electrically connected to the second current-limiting chip 30B, and a third bridge rectifier 70C disposed on the substrate body 10 and electrically connected to the third current-limiting chip 30C, and the control unit 4 is electrically connected between the rectifier unit 7 and the current-limiting unit 3. Furthermore, AC (Alternating Current) power source A can be transformed into DC (Direct Current) power source through the rectifier unit 7, thus the light-emitting unit 2 can obtain constant voltage from the DC power source through the current-limiting unit 3.

Third Embodiment

Figure 3:
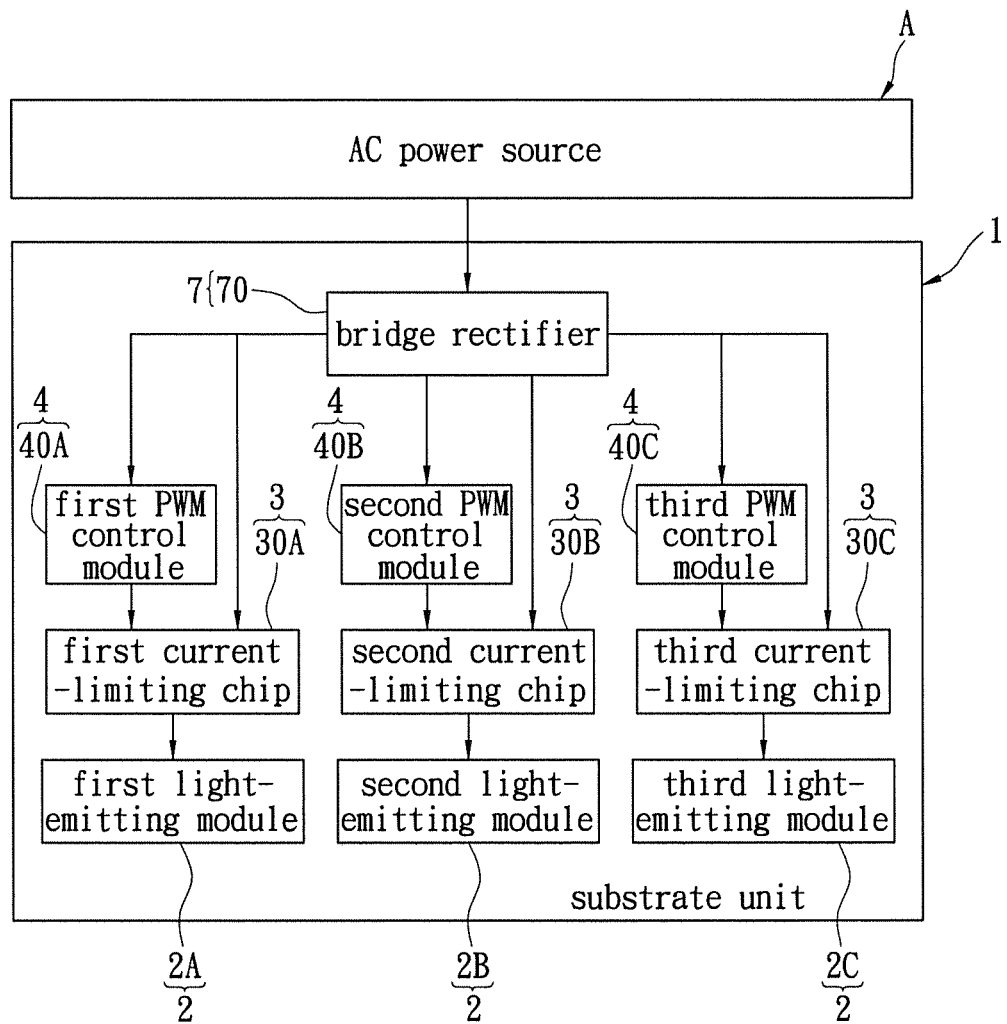
FIG. 3 shows a function block of the illumination device according to the third embodiment of the instant disclosure.

Referring to FIG. 3, where the third embodiment of the instant disclosure provides an illumination device for enhancing plant growth. Comparing FIG. 3 with FIG. 1C, the difference between the third embodiment and the first embodiment is as follows: the illumination device of the third embodiment further comprises a rectifier unit 7 including at least one bridge rectifier 70 disposed on the substrate body 10. In addition, the at least one bridge rectifier 70 is electrically connected to the first current-limiting chip 30A, the second current-limiting chip 30B, and the third current-limiting chip 30C, and the control unit 4 is electrically connected between the rectifier unit 7 and the current-limiting unit 3. Furthermore, AC (Alternating Current) power source A can be transformed into DC (Direct Current) power source through the rectifier unit 7, thus the light-emitting unit 2 can obtain constant voltage from the DC power source through the current-limiting unit 3.

Fourth Embodiment

Figure 4:
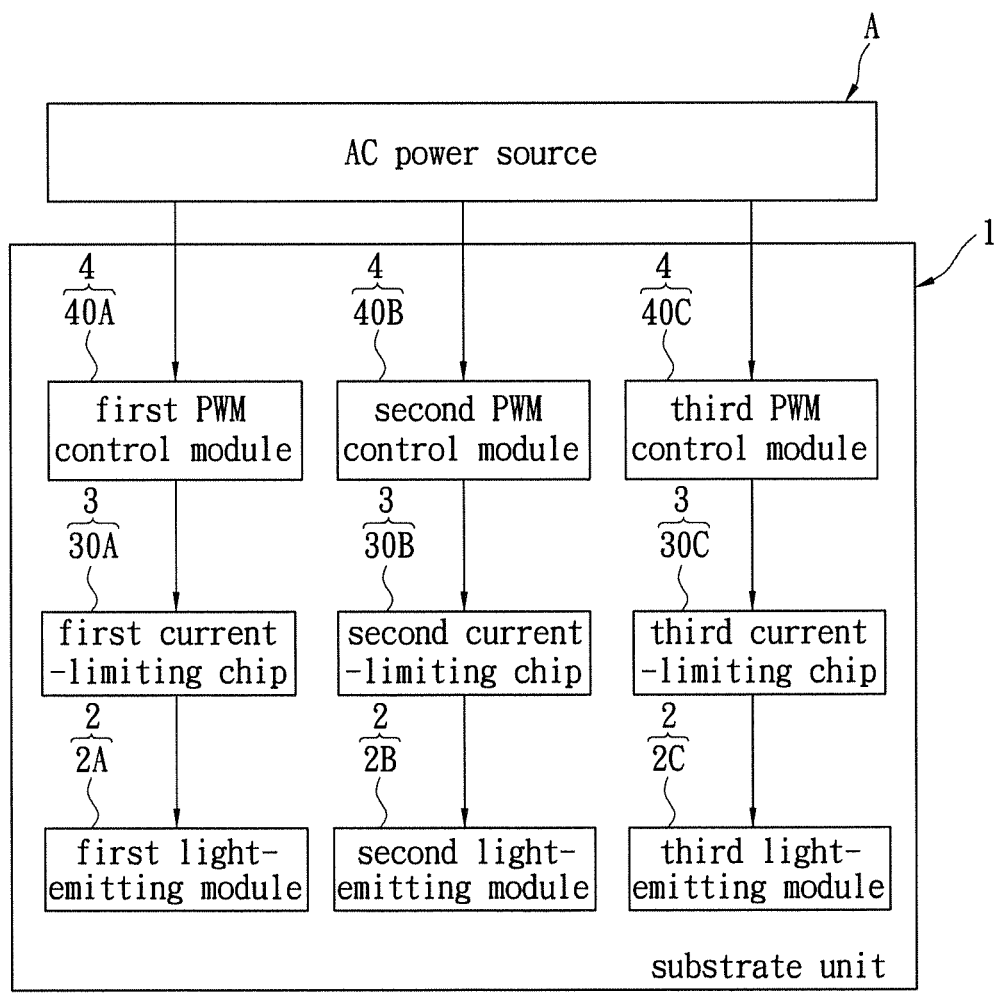
FIG. 4 shows a function block of the illumination device according to the fourth embodiment of the instant disclosure.

Referring to FIG. 4, where the fourth embodiment of the instant disclosure provides an illumination device for enhancing plant growth. Comparing FIG. 4 with FIG. 2 or 3, the difference between the fourth embodiment and the second or the third embodiment is as follows: each first LED chip 20A, each second LED chip 20B, and each third LED chip 20C are AC LED chips, thus the fourth embodiment can omit the rectifier unit 7 from the illumination device.

Fifth Embodiment

Figure 5A:
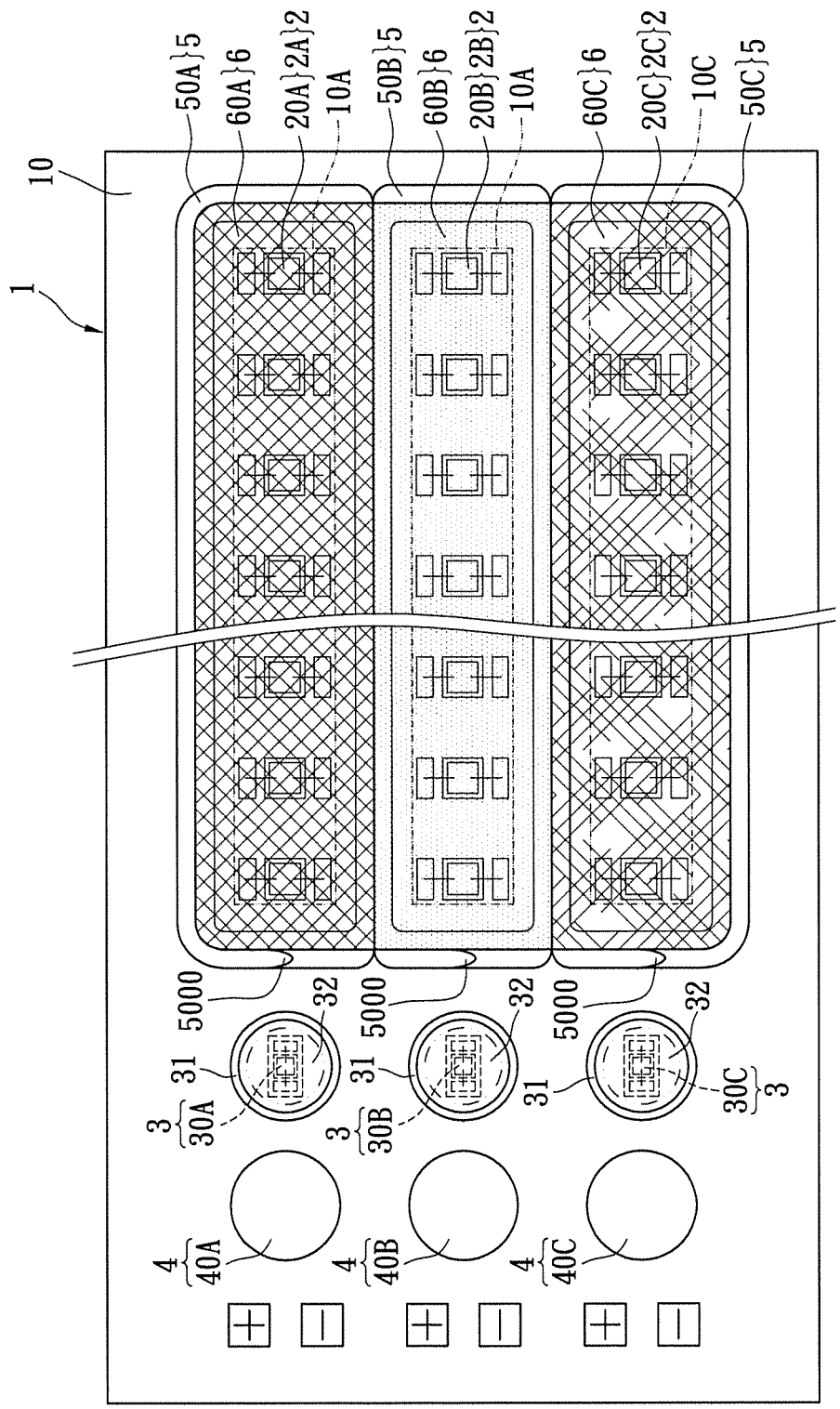
FIG. 5A shows a top, schematic view of the illumination device according to the fifth embodiment of the instant disclosure.
Figure 5B:
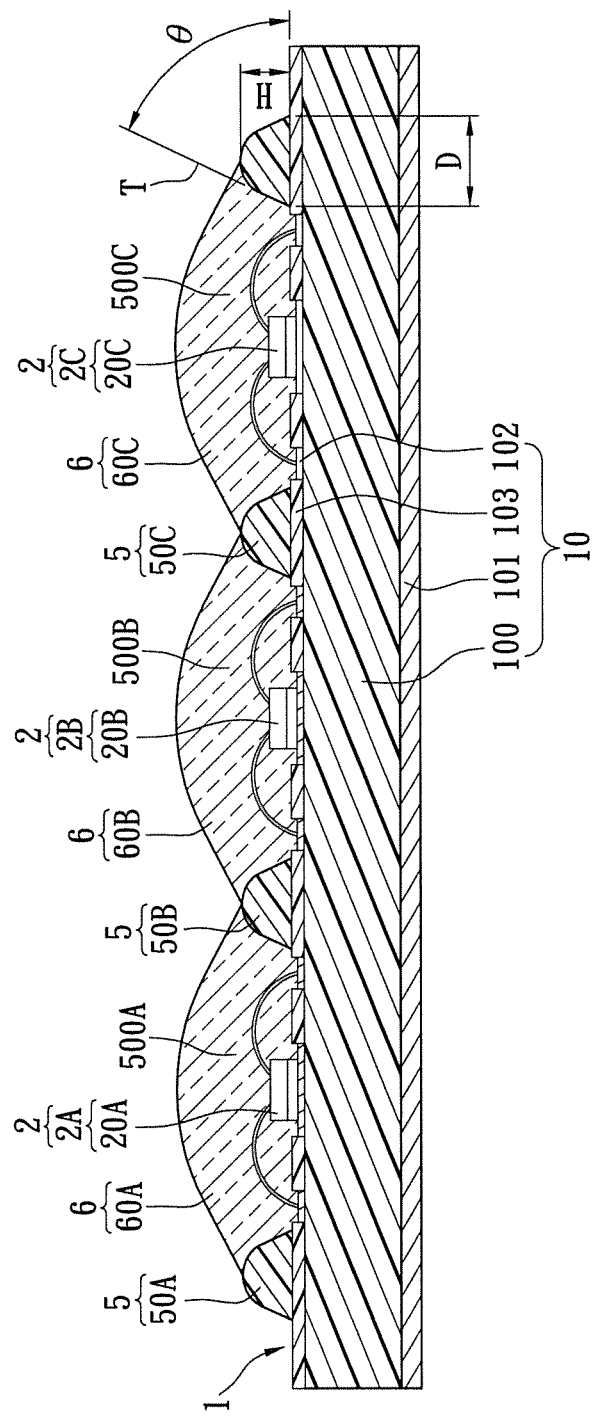
FIG. 5B shows a lateral, cross-sectional, schematic view of the illumination device according to the fifth embodiment of the instant disclosure.

Referring to FIGS. 5A and 5B, where the fifth embodiment of the instant disclosure provides an illumination device for enhancing plant growth. Comparing FIG. 5A with FIG. 1A and comparing FIG. 5B with FIG. 1B, the difference between the fifth embodiment and the first embodiment is as follows: in the fifth embodiment, the first surrounding colloid frame 50A, the second surrounding colloid frame 50B, and the third surrounding colloid frame 50C are sequentially connected with each other.

Sixth Embodiment

Figure 6A:
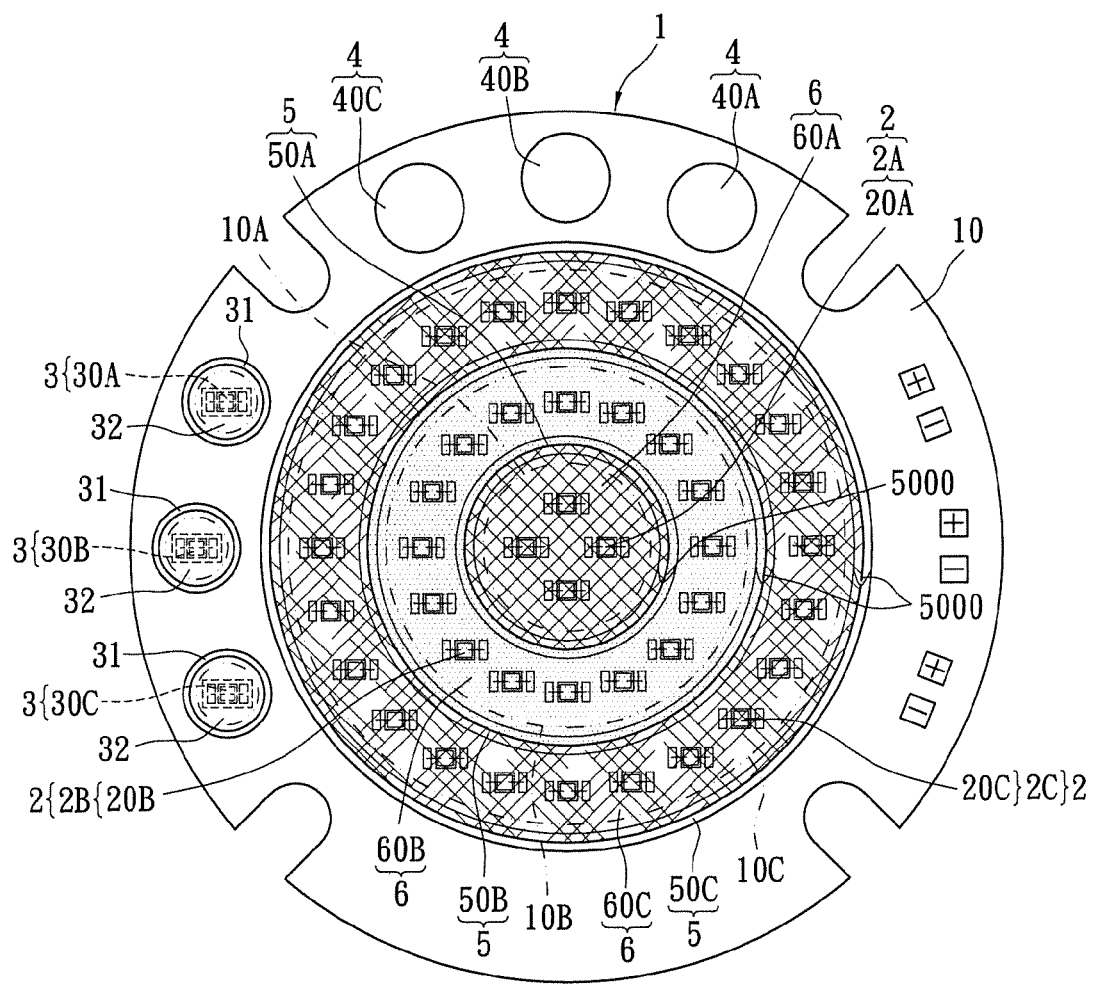
FIG. 6A shows a top, schematic view of the illumination device according to the sixth embodiment of the instant disclosure.
Figure 6B:
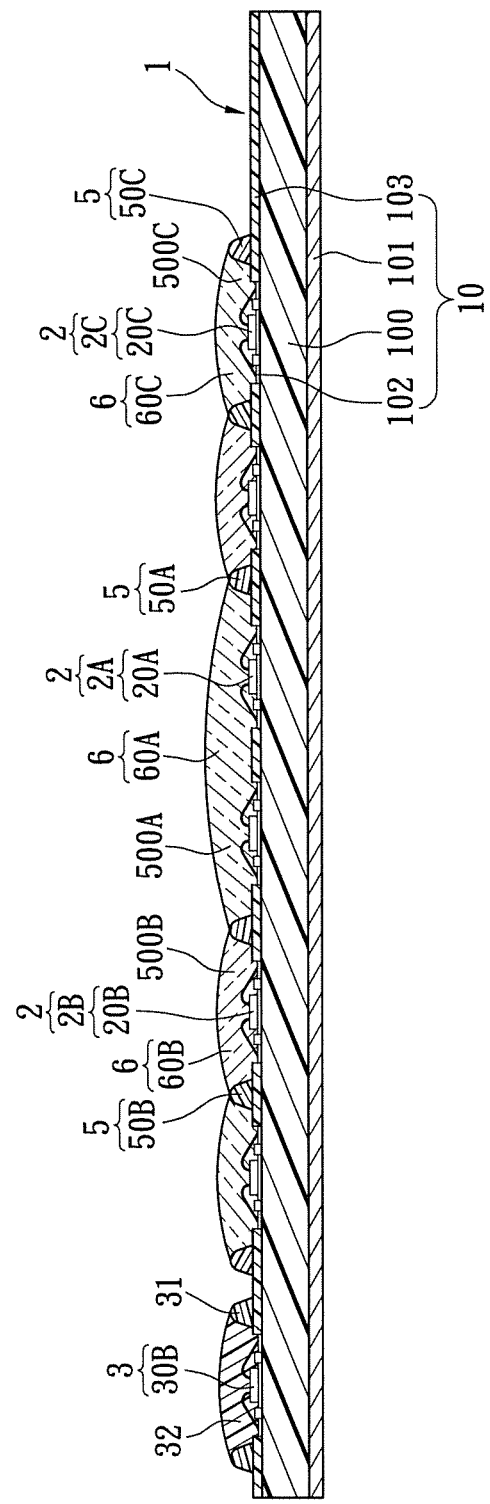
FIG. 6B shows a lateral, cross-sectional, schematic view of the illumination device according to the sixth embodiment of the instant disclosure.

Referring to FIGS. 6A and 6B, where the sixth embodiment of the instant disclosure provides an illumination device for enhancing plant growth. Comparing FIG. 6A with FIG. 1A and comparing FIG. 6B with FIG. 1B, the difference between the sixth embodiment and the first embodiment is as follows: in the sixth embodiment, the first package colloid body 60A is surrounded by the first surrounding colloid frame 50A, the second package colloid body 60B is disposed between the first surrounding colloid frame 50A and the second surrounding colloid frame 50B, and the third package colloid body 60C is disposed between the second surrounding colloid frame 50B and the third surrounding colloid frame 50C. Furthermore, the second surrounding colloid frame 50B surrounds the first surrounding colloid frame 50A, the third surrounding colloid frame 50C surrounds the second surrounding colloid frame 50B, the second LED chips 20B are disposed between the first surrounding colloid frame 50A and the second surrounding colloid frame 50B, and the third LED chips 20C are disposed between the second surrounding colloid frame 50B and the third surrounding colloid frame 50C.

In conclusion, the first PWM control module can control the first LED chips to generate a predetermined pulse frequency, the second PWM control module can control the second LED chips to generate a predetermined pulse frequency, and the third PWM control module can control the third LED chips to generate a predetermined pulse frequency, thus the illumination device of the instant disclosure can be used to enhance plant growth.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. An illumination device for enhancing plant growth, comprising:

a substrate unit including a substrate body having a first chip-placing region, a second chip-placing region, and a third chip-placing region, wherein the first chip-placing region, the second chip-placing region, and the third chip-placing region are disposed on the top surface of the substrate body;

a light-emitting unit including a first light-emitting module for generating a first optical wavelength, a second light-emitting module for generating a second optical wavelength, and a third light-emitting module for generating a third optical wavelength and a predetermined color temperature, wherein the first light-emitting module includes a plurality of first LED chips disposed on the first chip-placing region and electrically connected to the substrate body, the second light-emitting module includes a plurality of second LED chips disposed on the second chip-placing region and electrically connected to the substrate body, and the third light-emitting module includes a plurality of third LED chips disposed on the second chip-placing region and electrically connected to the substrate body;

a current-limiting unit including a first current-limiting chip disposed on the substrate body and electrically connected to the first light-emitting module, a second current-limiting chip disposed on the substrate body and electrically connected to the second light-emitting module, and a third current-limiting chip disposed on the substrate body and electrically connected to the third light-emitting module;

a control unit including a first PWM control module disposed on the substrate body and electrically connected to the first current-limiting chip, a second PWM control module disposed on the substrate body and electrically connected to the second current-limiting chip, and a third PWM control module disposed on the substrate body and electrically connected to the third current-limiting chip;

a frame unit including a first surrounding colloid frame, a second surrounding colloid frame, and a third surrounding colloid frame, wherein the first surrounding colloid frame, the second surrounding colloid frame, and the third surrounding colloid frame are surroundingly formed on the top surface of the substrate body, the first surrounding colloid frame surrounds the first LED chips to form a first colloid position limiting space corresponding to the first chip-placing region, the second surrounding colloid frame surrounds the second LED chips to form a second colloid position limiting space corresponding to the second chip-placing region, and the third surrounding colloid frame surrounds the third LED chips to form a third colloid position limiting space corresponding to the third chip-placing region; and a package unit including a first package colloid body filled into the first colloid position limiting space to cover the first LED chips, a second package colloid body filled into the second colloid position limiting space to cover the second LED chips, and a third package colloid body filled into the third colloid position limiting space to cover the third LED chips, wherein the first package colloid body is surrounded by the first surrounding colloid frame, the second package colloid body is surrounded by the second surrounding colloid frame, and the third package colloid body is surrounded by the third surrounding colloid frame.

2. The illumination device of claim 1, wherein the first surrounding colloid frame, the second surrounding colloid frame, and the third surrounding colloid frame are separated from each other by a predetermined distance or sequentially connected with each other, and the first colloid position limiting space, the second colloid position limiting space, and the third colloid position limiting space are separated from each other by a predetermined distance.

3. The illumination device of claim 1, wherein the first optical wavelength generated by the first light-emitting module is substantially between 600 nm and 700 nm, the second optical wavelength generated by the second light-emitting module is substantially between 400 nm and 500 nm, the third optical wavelength generated by the third light-emitting module is substantially between 400 nm and 700 nm, and the predetermined color temperature generated by the third light-emitting module is substantially between 2700 K and 10000 K.

4. The illumination device of claim 1, wherein the substrate unit includes a plurality of positive pads and negative pads disposed on the top surface of the substrate body, wherein each first LED chip has a positive electrode and a negative electrode, the positive electrode of each first LED chip corresponds to at least two of the positive pads, the negative electrode of each first LED chip corresponds to at least two of the negative pads, wherein each second LED chip has a positive electrode and a negative electrode, the positive electrode of each second LED chip corresponds to at least two of the positive pads, the negative electrode of each second LED chip corresponds to at least two of the negative pads, wherein each third LED chip has a positive electrode and a negative electrode, the positive electrode of each third LED chip corresponds to at least two of the positive pads, the negative electrode of each third LED chip corresponds to at least two of the negative pads.

5. The illumination device of claim 4, wherein the positive electrode of each first LED chip is electrically connected to one of the at least two positive pads, the negative electrode of each first LED chip is electrically connected to one of the at least two negative pads, wherein the positive electrode of each second LED chip is electrically connected to one of the at least two positive pads, the negative electrode of each second LED chip is electrically connected to one of the at least two negative pads, wherein the positive electrode of each third LED chip is electrically connected to one of the at least two positive pads, the negative electrode of each third LED chip is electrically connected to one of the at least two negative pads.

6. The illumination device of claim 1, further comprising a rectifier unit including at least one bridge rectifier disposed on the substrate body, wherein the at least one bridge rectifier is electrically connected to the first current-limiting chip, the second current-limiting chip, and the third current-limiting chip, and the control unit is electrically connected between the rectifier unit and the current-limiting unit.

7. The illumination device of claim 1, further comprising a rectifier unit including a first bridge rectifier disposed on the substrate body and electrically connected to the first current-limiting chip, a second bridge rectifier disposed on the substrate body and electrically connected to the second current-limiting chip, and a third bridge rectifier disposed on the substrate body and electrically connected to the third current-limiting chip, and the control unit is electrically connected between the rectifier unit and the current-limiting unit.

8. An illumination device for enhancing plant growth, comprising:

a substrate unit including a substrate body having a first chip-placing region, a second chip-placing region, and a third chip-placing region, wherein the first chip-placing region, the second chip-placing region, and the third chip-placing region are disposed on the top surface of the substrate body;

a light-emitting unit including a first light-emitting module for generating a first optical wavelength, a second light-emitting module for generating a second optical wavelength, and a third light-emitting module for generating a third optical wavelength and a predetermined color temperature, wherein the first light-emitting module includes a plurality of first LED chips disposed on the first chip-placing region and electrically connected to the substrate body, the second light-emitting module includes a plurality of second LED chips disposed on the second chip-placing region and electrically connected to the substrate body, and the third light-emitting module includes a plurality of third LED chips disposed on the second chip-placing region and electrically connected to the substrate body;

a current-limiting unit including a first current-limiting chip disposed on the substrate body and electrically connected to the first light-emitting module, a second current-limiting chip disposed on the substrate body and electrically connected to the second light-emitting module, and a third current-limiting chip disposed on the substrate body and electrically connected to the third light-emitting module;

a control unit including a first PWM control module disposed on the substrate body and electrically connected to the first current-limiting chip, a second PWM control module disposed on the substrate body and electrically connected to the second current-limiting chip, and a third PWM control module disposed on the substrate body and electrically connected to the third current-limiting chip;

a frame unit including a first surrounding colloid frame, a second surrounding colloid frame, and a third surrounding colloid frame, wherein the first surrounding colloid frame, the second surrounding colloid frame, and the third surrounding colloid frame are surroundingly formed on the top surface of the substrate body, the first surrounding colloid frame surrounds the first LED chips to form a first colloid position limiting space corresponding to the first chip-placing region, the second surrounding colloid frame surrounds the second LED chips to form a second colloid position limiting space corresponding to the second chip-placing region, and the third surrounding colloid frame surrounds the third LED chips to form a third colloid position limiting space corresponding to the third chip-placing region; and a package unit including a first package colloid body filled into the first colloid position limiting space to cover the first LED chips, a second package colloid body filled into the second colloid position limiting space to cover the second LED chips, and a third package colloid body filled into the third colloid position limiting space to cover the third LED chips, wherein the first package colloid body is surrounded by the first surrounding colloid frame, the second package colloid body is disposed between the first surrounding colloid frame and the second surrounding colloid frame, and the third package colloid body is disposed between the second surrounding colloid frame and the third surrounding colloid frame.

9. The illumination device of claim 8, wherein the second surrounding colloid frame surrounds the first surrounding colloid frame, the third surrounding colloid frame surrounds the second surrounding colloid frame, the second LED chips are disposed between the first surrounding colloid frame and the second surrounding colloid frame, and the third LED chips are disposed between the second surrounding colloid frame and the third surrounding colloid frame.

10. The illumination device of claim 8, wherein the first optical wavelength generated by the first light-emitting module is substantially between 600 nm and 700 nm, the second optical wavelength generated by the second light-emitting module is substantially between 400 nm and 500 nm, the third optical wavelength generated by the third light-emitting module is substantially between 400 nm and 700 nm, and the predetermined color temperature generated by the third light-emitting module is substantially between 2700 K and 10000 K.

11. The illumination device of claim 8, wherein the substrate unit includes a plurality of positive pads and negative pads disposed on the top surface of the substrate body, wherein each first LED chip has a positive electrode and a negative electrode, the positive electrode of each first LED chip corresponds to at least two of the positive pads, the negative electrode of each first LED chip corresponds to at least two of the negative pads, wherein each second LED chip has a positive electrode and a negative electrode, the positive electrode of each second LED chip corresponds to at least two of the positive pads, the negative electrode of each second LED chip corresponds to at least two of the negative pads, wherein each third LED chip has a positive electrode and a negative electrode, the positive electrode of each third LED chip corresponds to at least two of the positive pads, the negative electrode of each third LED chip corresponds to at least two of the negative pads.

12. The illumination device of claim 11, wherein the positive electrode of each first LED chip is electrically connected to one of the at least two positive pads, the negative electrode of each first LED chip is electrically connected to one of the at least two negative pads, wherein the positive electrode of each second LED chip is electrically connected to one of the at least two positive pads, the negative electrode of each second LED chip is electrically connected to one of the at least two negative pads, wherein the positive electrode of each third LED chip is electrically connected to one of the at least two positive pads, the negative electrode of each third LED chip is electrically connected to one of the at least two negative pads.

13. The illumination device of claim 8, further comprising a rectifier unit including at least one bridge rectifier disposed on the substrate body, wherein the at least one bridge rectifier is electrically connected to the first current-limiting chip, the second current-limiting chip, and the third current-limiting chip, and the control unit is electrically connected between the rectifier unit and the current-limiting unit.

14. The illumination device of claim 8, further comprising a rectifier unit including a first bridge rectifier disposed on the substrate body and electrically connected to the first current-limiting chip, a second bridge rectifier disposed on the substrate body and electrically connected to the second current-limiting chip, and a third bridge rectifier disposed on the substrate body and electrically connected to the third current-limiting chip, and the control unit is electrically connected between the rectifier unit and the current-limiting unit.

15. An illumination device for enhancing plant growth, comprising:

a substrate unit including a substrate body having a first chip-placing region, a second chip-placing region, and a third chip-placing region, wherein the first chip-placing region, the second chip-placing region, and the third chip-placing region are disposed on the top surface of the substrate body;

a light-emitting unit including a first light-emitting module for generating a first optical wavelength, a second light-emitting module for generating a second optical wavelength, and a third light-emitting module for generating a third optical wavelength and a predetermined color temperature, wherein the first light-emitting module includes a plurality of first LED chips disposed on the first chip-placing region and electrically connected to the substrate body, the second light-emitting module includes a plurality of second LED chips disposed on the second chip-placing region and electrically connected to the substrate body, and the third light-emitting module includes a plurality of third LED chips disposed on the second chip-placing region and electrically connected to the substrate body;

a current-limiting unit including a first current-limiting chip disposed on the substrate body and electrically connected to the first light-emitting module, a second current-limiting chip disposed on the substrate body and electrically connected to the second light-emitting module, and a third current-limiting chip disposed on the substrate body and electrically connected to the third light-emitting module; and a control unit including a first PWM control module disposed on the substrate body and electrically connected to the first current-limiting chip, a second PWM control module disposed on the substrate body and electrically connected to the second current-limiting chip, and a third PWM control module disposed on the substrate body and electrically connected to the third current-limiting chip.

16. The illumination device of claim 15, wherein the first optical wavelength generated by the first light-emitting module is substantially between 600 nm and 700 nm, the second optical wavelength generated by the second light-emitting module is substantially between 400 nm and 500 nm, the third optical wavelength generated by the third light-emitting module is substantially between 400 nm and 700 nm, and the predetermined color temperature generated by the third light-emitting module is substantially between 2700 K and 10000 K.

17. The illumination device of claim 15, wherein the substrate unit includes a plurality of positive pads and negative pads disposed on the top surface of the substrate body, wherein each first LED chip has a positive electrode and a negative electrode, the positive electrode of each first LED chip corresponds to at least two of the positive pads, the negative electrode of each first LED chip corresponds to at least two of the negative pads, wherein each second LED chip has a positive electrode and a negative electrode, the positive electrode of each second LED chip corresponds to at least two of the positive pads, the negative electrode of each second LED chip corresponds to at least two of the negative pads, wherein each third LED chip has a positive electrode and a negative electrode, the positive electrode of each third LED chip corresponds to at least two of the positive pads, the negative electrode of each third LED chip corresponds to at least two of the negative pads.

18. The illumination device of claim 17, wherein the positive electrode of each first LED chip is electrically connected to one of the at least two positive pads, the negative electrode of each first LED chip is electrically connected to one of the at least two negative pads, wherein the positive electrode of each second LED chip is electrically connected to one of the at least two positive pads, the negative electrode of each second LED chip is electrically connected to one of the at least two negative pads, wherein the positive electrode of each third LED chip is electrically connected to one of the at least two positive pads, the negative electrode of each third LED chip is electrically connected to one of the at least two negative pads.

19. The illumination device of claim 15, further comprising a rectifier unit including at least one bridge rectifier disposed on the substrate body, wherein the at least one bridge rectifier is electrically connected to the first current-limiting chip, the second current-limiting chip, and the third current-limiting chip, and the control unit is electrically connected between the rectifier unit and the current-limiting unit.

20. The illumination device of claim 15, further comprising a rectifier unit including a first bridge rectifier disposed on the substrate body and electrically connected to the first current-limiting chip, a second bridge rectifier disposed on the substrate body and electrically connected to the second current-limiting chip, and a third bridge rectifier disposed on the substrate body and electrically connected to the third current-limiting chip, and the control unit is electrically connected between the rectifier unit and the current-limiting unit.

* * * * *